United States Patent
Lin et al.

(10) Patent No.: US 9,632,880 B2
(45) Date of Patent: Apr. 25, 2017

(54) DATA STORAGE DEVICE AND FLASH MEMORY CONTROL METHOD

(71) Applicant: Silicon Motion, Inc., Jhubei, Hsinchu County (TW)

(72) Inventors: Chien-Cheng Lin, Yilan (TW); Chia-Chi Liang, Taichung (TW); Chang-Chieh Huang, Zhubei (TW); Jie-Hao Lee, Kaohsiung (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 77 days.

(21) Appl. No.: 14/534,488

(22) Filed: Nov. 6, 2014

(65) Prior Publication Data

US 2015/0186261 A1    Jul. 2, 2015

Related U.S. Application Data

(60) Provisional application No. 61/920,830, filed on Dec. 26, 2013.

(51) Int. Cl.
 *G06F 11/14*  (2006.01)
 *G06F 12/02*  (2006.01)
 (Continued)

(52) U.S. Cl.
 CPC ...... *G06F 11/1469* (2013.01); *G06F 11/1072* (2013.01); *G06F 12/0246* (2013.01);
 (Continued)

(58) Field of Classification Search
 CPC ......... Y02B 60/1225; G06F 2212/7203; G06F 2212/1032; G06F 2212/7202;
 (Continued)

(56) References Cited

U.S. PATENT DOCUMENTS 6,895,490 B1   5/2005  Moore et al.
6,970,890 B1   11/2005 Bruce et al.
(Continued)

FOREIGN PATENT DOCUMENTS

TW   201142589   12/2011
TW   201305817    2/2013
(Continued)

OTHER PUBLICATIONS

Office Action dated May 26, 2016, issued in U.S. Appl. No. 14/534,686 (copy not provided).

(Continued)

*Primary Examiner* — David X Yi
*Assistant Examiner* — Francisco Grullon
(74) *Attorney, Agent, or Firm* — McClure, Qualey & Rodack, LLP (57) ABSTRACT

A data storage device with flash memory and a flash memory control method are disclosed, which upload the physical-to-logical address mapping information of one block to the flash memory section by section. A microcontroller is configured to allocate a flash memory to provide a first run-time write block. Between a first write operation and a second write operation of the first run-time write block, the microcontroller updates a logical-to-physical address mapping table in accordance with just part of a first physical-to-logical address mapping table. The logical-to-physical address mapping table is provided within the flash memory. The first physical-to-logical address mapping table is established in the random access memory to record logical addresses corresponding to physical addresses of one block.

16 Claims, 6 Drawing Sheets

(51) Int. Cl.
*G06F 11/10* (2006.01)
*G11C 29/52* (2006.01)
*G06F 12/121* (2016.01)
*G11C 29/04* (2006.01)

(52) U.S. Cl.
CPC ............ *G06F 12/121* (2013.01); *G11C 29/52* (2013.01); *G06F 2212/1032* (2013.01); *G06F 2212/69* (2013.01); *G06F 2212/7201* (2013.01); *G06F 2212/7202* (2013.01); *G06F 2212/7203* (2013.01); *G06F 2212/7209* (2013.01); *G11C 2029/0411* (2013.01); *Y02B 60/1225* (2013.01)

(58) Field of Classification Search
CPC ............... G06F 12/121; G06F 11/1072; G06F 11/1469; G06F 2212/7209; G06F 2212/69; G06F 2212/7201; G06F 12/0246; G06F 3/0604; G06F 3/0679; G06F 3/0631; G06F 3/0685; G06F 3/0658; G06F 3/0656; G06F 12/0866; G06F 12/0804; G06F 3/0616; G06F 3/064; G11C 2029/0411; G11C 29/52; G11C 11/5628
See application file for complete search history.

(56) References Cited

U.S. PATENT DOCUMENTS

| | | | |
|---|---|---|---|
| 6,988,175 B2 | 1/2006 | Lasser | |
| 7,603,525 B2 | 10/2009 | Lasser | |
| 7,886,108 B2 | 2/2011 | Lee et al. | |
| 7,904,635 B2 | 3/2011 | Deng et al. | |
| 8,078,794 B2 | 12/2011 | Lee et al. | |
| 8,352,706 B2 | 1/2013 | Yano et al. | |
| 8,688,894 B2 * | 4/2014 | Kuehne | G06F 12/0246 711/103 |
| 9,311,006 B2 | 4/2016 | Moshayedi | |
| 9,355,028 B2 | 5/2016 | Cheng et al. | |
| 2003/0163630 A1 | 8/2003 | Aasheim et al. | |
| 2004/0268063 A1 | 12/2004 | Lasser | |
| 2006/0282644 A1 | 12/2006 | Wong | |
| 2007/0021963 A1 | 1/2007 | Deng et al. | |
| 2008/0104309 A1 | 5/2008 | Cheon et al. | |
| 2008/0126680 A1 | 5/2008 | Lee et al. | |
| 2008/0215800 A1 | 9/2008 | Lee et al. | |
| 2009/0144501 A2 | 6/2009 | Yim et al. | |
| 2009/0172262 A1 | 7/2009 | Olbrich et al. | |
| 2009/0240871 A1 * | 9/2009 | Yano | G06F 12/0246 711/103 |
| 2009/0240873 A1 * | 9/2009 | Yu | G06F 3/0608 711/103 |
| 2009/0327589 A1 * | 12/2009 | Moshayedi | G06F 11/1441 711/103 |
| 2009/0327591 A1 | 12/2009 | Moshayedi | |
| 2009/0327840 A1 | 12/2009 | Moshayedi | |
| 2010/0082883 A1 | 4/2010 | Chen et al. | |
| 2010/0169551 A1 * | 7/2010 | Yano | G06F 12/0246 711/103 |
| 2010/0174851 A1 * | 7/2010 | Leibowitz | G06F 3/0616 711/103 |
| 2010/0306451 A1 * | 12/2010 | Johnson | G06F 3/0607 711/103 |
| 2011/0055458 A1 * | 3/2011 | Kuehne | G06F 12/0246 711/103 |
| 2011/0289255 A1 * | 11/2011 | Wang | G06F 12/0246 711/1 |
| 2012/0239862 A1 * | 9/2012 | Seo | G06F 12/0246 711/103 |
| 2012/0297121 A1 | 11/2012 | Gorobets et al. | |
| 2012/0311245 A1 | 12/2012 | Yano et al. | |
| 2013/0124782 A1 * | 5/2013 | Huang | G06F 12/0246 711/103 |
| 2013/0304975 A1 | 11/2013 | Wang et al. | |
| 2013/0326120 A1 | 12/2013 | Cheng | |
| 2013/0326121 A1 * | 12/2013 | Cheng | G06F 12/0246 711/103 |
| 2013/0326169 A1 | 12/2013 | Shaharabany et al. | |
| 2014/0006898 A1 | 1/2014 | Sharon et al. | |
| 2014/0101369 A1 * | 4/2014 | Tomlin | G06F 12/0246 711/103 |
| 2014/0122776 A1 | 5/2014 | Maghraoui et al. | |
| 2014/0136753 A1 * | 5/2014 | Tomlin | G06F 12/0246 711/103 |
| 2015/0261444 A1 | 9/2015 | Yoshi et al. | |

FOREIGN PATENT DOCUMENTS

| | | |
|---|---|---|
| TW | 201348958 | 12/2013 |
| TW | 201348959 | 12/2013 |

OTHER PUBLICATIONS

Office Action dated Jun. 21, 2016, issued in U.S. Appl. No. 14/534,535 (copy not provided).
Office Action dated Jun. 30, 2016, issued in U.S. Appl. No. 14/534,633 (copy not provided).
Office Action dated Jul. 1, 2016, issued in U.S. Appl. No. 14/534,603 (copy not provided).

* cited by examiner

DATA STORAGE DEVICE AND FLASH MEMORY CONTROL METHOD

CROSS REFERENCE TO RELATED APPLICATIONS

This application claims the benefit of U.S. Provisional Application No. 61/920,830, filed Dec. 26, 2013, the entirety of which is incorporated by reference herein.

BACKGROUND OF THE INVENTION

Field of the Invention

The present invention relates to data storage devices with flash memory and flash memory control methods.

Description of the Related Art

Flash memory, a data storage medium, is common in today's data storage devices. For example, flash memory is typically used in memory cards, USB flash devices, solid-state drives, and so on. In another application with multi-chip package technology, a NAND flash chip and a controller chip are combined in one package as an embedded multi-media card (e.g. eMMC).

A flash memory device provides storage space which is divided into blocks, and each block includes a plurality of pages. An erase operation designed for flash memory is performed on a block basis, to release space block by block. For the convenient management of the flash memory, the physical-to-logical address mapping information of each block is dynamically collected in a volatile memory (e.g., an SRAM). In conventional technologies, the dynamically collected physical-to-logical address mapping information of an entire block is uploaded to the flash memory for non-volatile storage at one time. The upload of the physical-to-logical address mapping information of an entire block is very time consuming.

BRIEF SUMMARY OF THE INVENTION

Data storage device with flash memory and flash memory control method are disclosed, which upload the physical-to-logical address mapping information of one block to the flash memory section by section.

A data storage device in accordance with an exemplary embodiment of the disclosure comprises a flash memory and a control unit. The flash memory is divided into a plurality of blocks. Each block comprises a plurality of pages. The control unit couples the flash memory to a host and comprises a microcontroller and a random access memory. The microcontroller is configured to allocate the flash memory to provide a first run-time write block from the blocks. Between a first write operation and a second write operation of the first run-time write block, the microcontroller updates a logical-to-physical address mapping table in accordance with just part of a first physical-to-logical address mapping table. The logical-to-physical address mapping table is provided within the flash memory. The first physical-to-logical address mapping table is established in the random access memory to record logical addresses corresponding to physical addresses of one block.

A flash memory control method in accordance with an exemplary embodiment of the disclosure comprises the following steps: allocating a flash memory to provide a first run-time write block from a plurality of blocks of the flash memory, each block comprising a plurality of pages; and, a first write operation and a second write operation of the first run-time write block, updating a logical-to-physical address mapping table in accordance with just part of a first physical-to-logical address mapping table. The logical-to-physical address mapping table is provided within the flash memory. The first physical-to-logical address mapping table is established in the random access memory to record logical addresses corresponding to physical addresses of one block.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
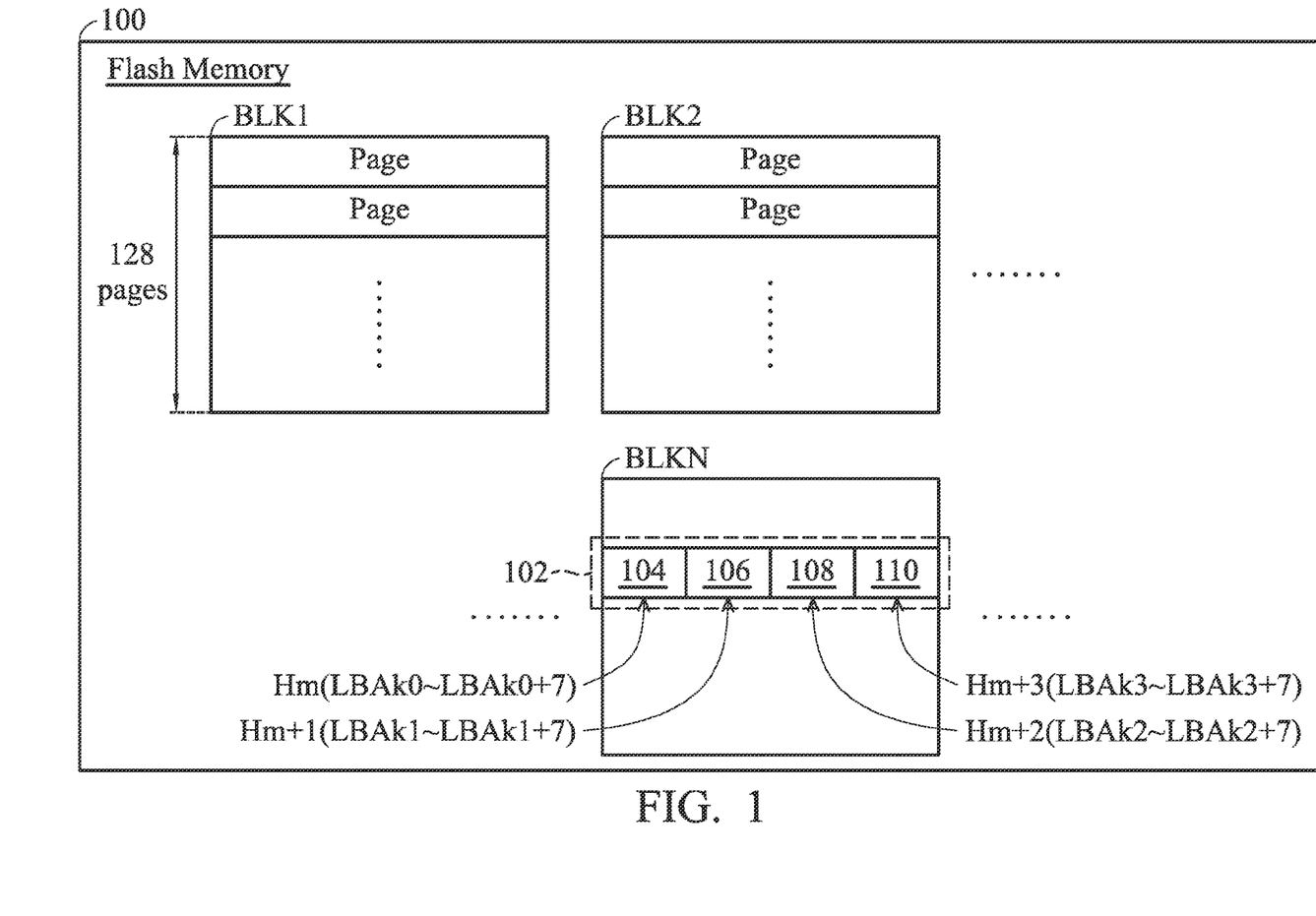
FIG. 1 depicts a storage space provided by a flash memory 100.

FIG. 1 depicts a storage space provided by a flash memory 100. The storage space provided by the flash memory 100 is divided into blocks (e.g., BLK1, BLK2 . . . BLKN . . . ). Each block includes a plurality of pages. Each page includes a plurality of sectors. For example, page 102 provided within block BLKN includes four sectors 104, 106, 108 and 110. When each sector is assigned to store user data of one host page (corresponding to a series of logical addresses, e.g. LBAk to LBAk+7), each physical page is assigned to four host pages. For example, the four sectors 104, 106, 108 and 110 correspond to four host pages Hm (i.e. from LBAk0 to LBAk0+7), Hm+1 (i.e. from LBAk1 to LBAk1+7), Hm+2 (i.e. from LBAk2 to LBAk2+7) and Hm+3 (i.e. from LBAk3 to LBAk3+7), respectively. When one block contains 128 pages, there are 128×4 host pages corresponding to the 128×4 sectors of the block. For each block, the mapping information between the 128×4 sectors and the 128×4 host pages has to be recorded for storage space management.

Figure 2:
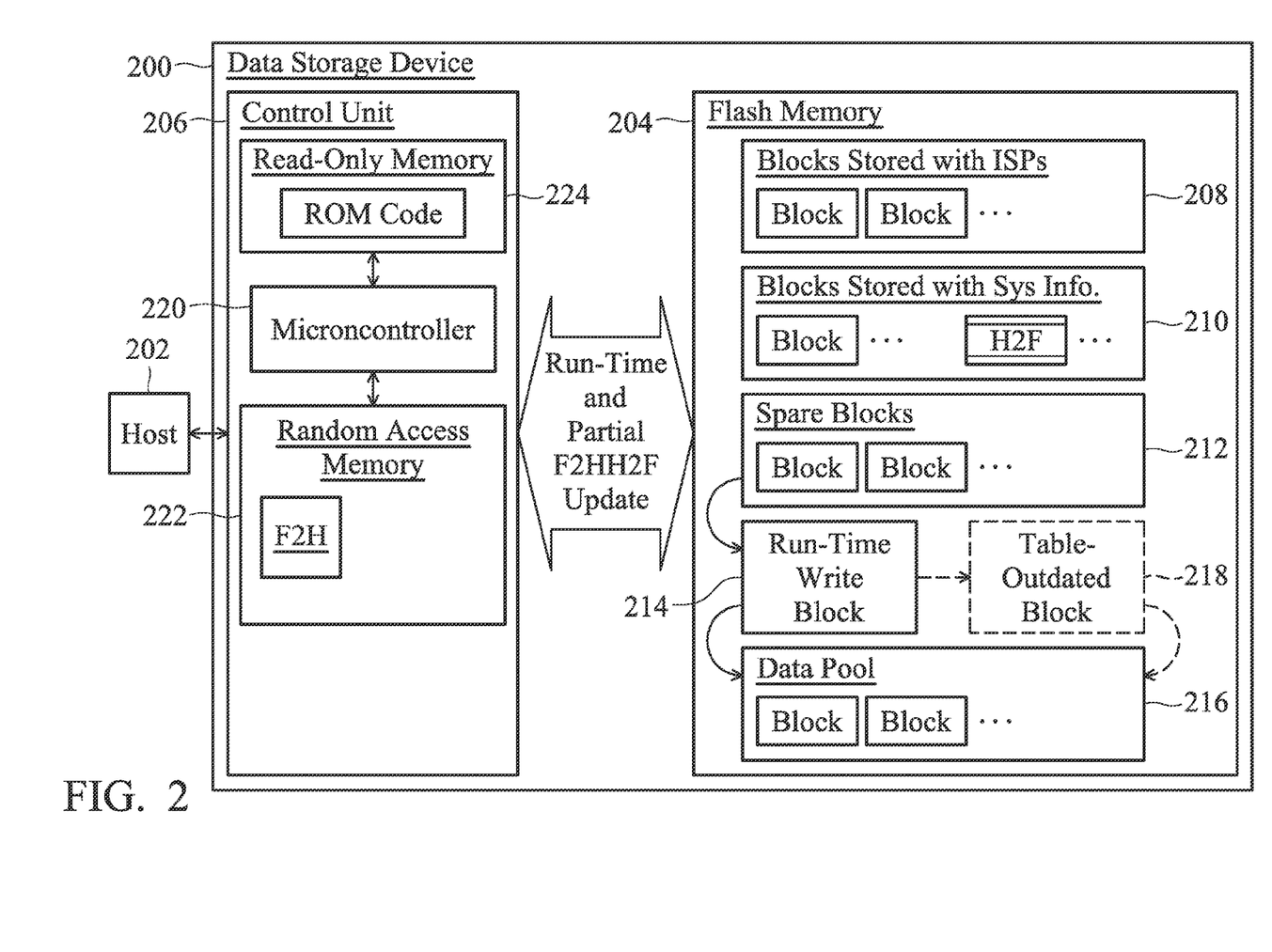
FIG. 2 is a block diagram depicting a data storage device 200 in accordance with an exemplary embodiment of the disclosure, wherein a way to establish and dynamically update the mapping information between the host 202 and the flash memory 204 is shown.

FIG. 2 is a block diagram depicting a data storage device 200 in accordance with an exemplary embodiment of the disclosure, wherein the way to establish and dynamically update the mapping information between the host 202 and the flash memory 204 is shown. The data storage device 200 includes the flash memory 204 as well as a control unit 206.

In the flash memory 204, the blocks are allocated for several purposes. Blocks 208 are stored with in-system programs (ISPs). Blocks 210 are stored with system information. Blocks 212 are spare blocks. A run-time write block 214, allocated from the spare blocks, is for reception of write data, which will be pushed into the data pool 216 as a data block. In another exemplary embodiment (referring to the dashed lines and block), the run-time write block 214 with correct mapping information in the random access memory 222 but outdated mapping information in the flash memory 204 is first relabeled as a table-outdated block 218 and, when the mapping table update of the table-outdated block 218 is completed, the table-outdated block 218 is relabeled as a data block and pushed into the data pool 216. The flash memory 204 may further contain free blocks not shown in the figure.

The control unit 206 couples the flash memory 204 to the host 202 and comprises a microcontroller 220, a random access memory 222 and a read-only memory 224. A ROM code is stored in the read-only memory 224. The microcontroller 220 operates the flash memory 204 by executing the ROM code stored in the read-only memory 224 or/and by executing the ISPs stored in the blocks 208 of the flash memory 204. The microcontroller 220 is configured to perform the block allocation of the flash memory 204 (as shown in FIG. 2) and establish a physical-to-logical address mapping table F2H in the random access memory 222 and provide a logical-to-physical address mapping table H2F in the flash memory 204 (e.g., recorded by the system info blocks 210). The physical-to-logical address mapping table F2H is established in the random access memory 222 to dynamically record logical addresses corresponding to physical addresses of the run-time write block 214 (or the table-outdated block 218). Instead of updating the logical-to-physical address mapping table H2F in accordance with the entire physical-to-logical address mapping table F2H at one time, the microcontroller 220 is configured to update the logical-to-physical address mapping table H2F in accordance with just part of the physical-to-logical address mapping table F2H between two write operations of the run-time write block 214. The action to update the logical-to-physical address mapping table H2F in accordance with the physical-to-logical address mapping table F2H is named "F2H•H2F update (seal)." The microcontroller 220 is configured to perform a run-time (i.e. between two write operations of the run-time write block 214) and partial (i.e. just part of the physical-to-logical address mapping table F2H) F2H•H2F update, considerably improving the system efficiency of the data storage device 200.

Figure 3:
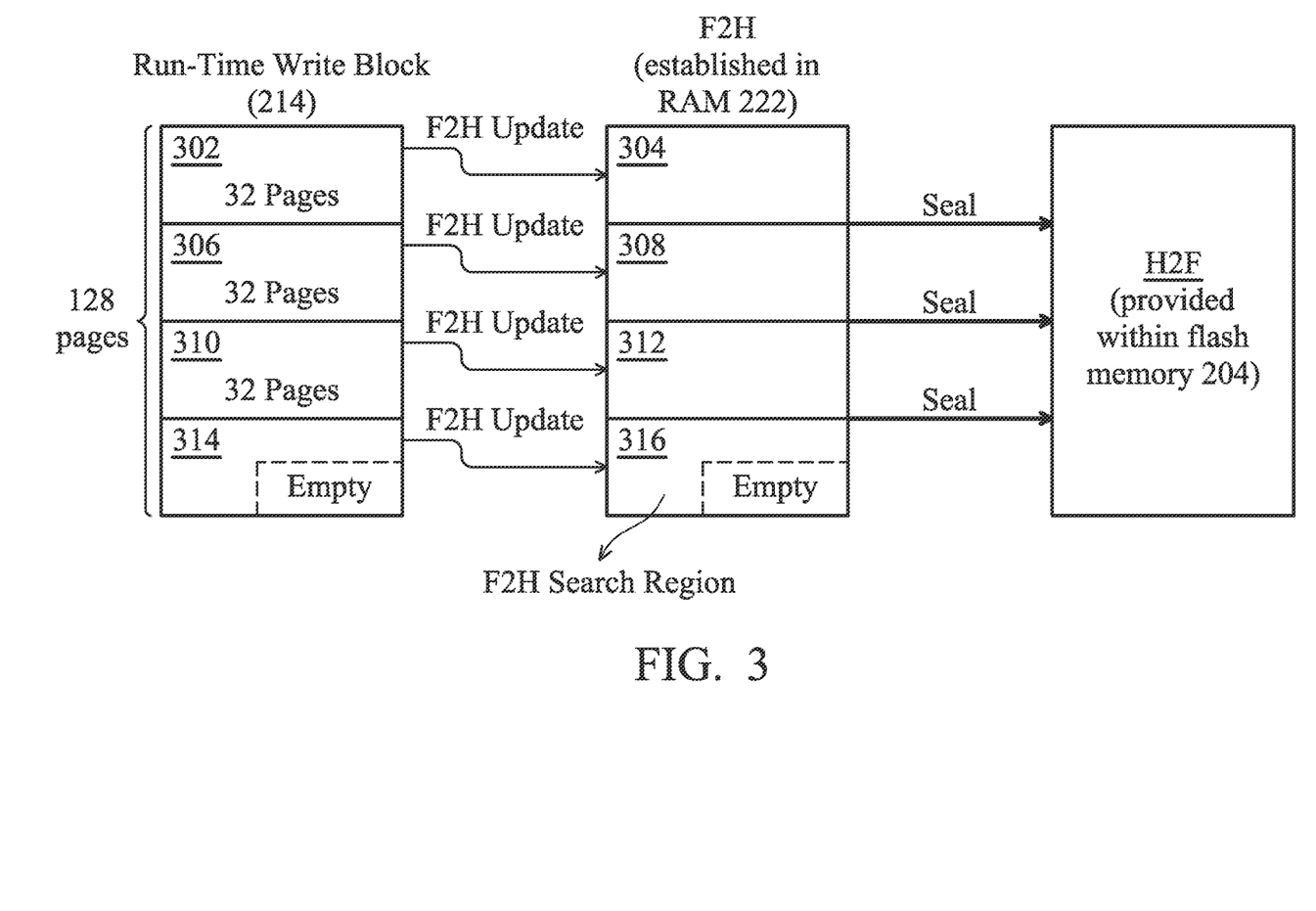
FIG. 3 depicts a run-time and partial F2H→H2F update in accordance with an exemplary embodiment of the disclosure, wherein the physical-to-logical address mapping table F2H is established in the random access memory 222 in accordance with write operations on the run-time write block 214.

FIG. 3 depicts a run-time and partial F2H→H2F update in accordance with an exemplary embodiment of the disclosure, wherein the physical-to-logical address mapping table F2H is established in the random access memory 222 in accordance with write operations on the run-time write block 214. After writing user data of a predetermined size (e.g. 32 pages, smaller than the total size, 128 pages, of the run-time write block 214) into the run-time write block 214, the microcontroller 220 of FIG. 2 is configured to update the logical-to-physical address mapping table H2F provided within the flash memory 204 in accordance with a section of the physical-to-logical address mapping table F2H corresponding to the user data of the predetermined size. As shown, the F2H information 304 is established to form the physical-to-logical address mapping table F2H in the random access memory 222 in accordance with the write operations on the 32 pages 302. After the write operations on the 32 pages 302 are completed, the logical-to-physical address mapping table H2F provided within the flash memory 204 is updated in accordance with the F2H information 304 (i.e. a section of the physical-to-logical address mapping table F2H corresponding to the 32 pages 302). Similarly, the F2H information 308 is established in accordance with the write operations on the 32 pages 306. After the write operations on the 32 pages 306 are completed, the logical-to-physical address mapping table H2F is updated in accordance with the F2H information 308. Similarly, the F2H information 312 is established in accordance with the write operations on the 32 pages 310. After the write operations on the 32 pages 310 are completed, the logical-to-physical address mapping table H2F is updated in accordance with the F2H information 312. As for the last 32 pages 314 have not been filled full, the F2H information 316 is not fully established neither. Thus, the logical-to-physical address mapping table H2F provided within the flash memory 204 has not been updated in accordance with the F2H information 316 yet. The microcontroller 220 of FIG. 2 may be further configured to use an indicator to indicate the F2H information 316 (i.e. the mapping information that has not been uploaded to the flash memory 204). When a search scheme for the un-uploaded mapping information is requested, the microcontroller 220 is instantly directed to the F2H information 316 in accordance with the indicator, which is very time-saving. The search region for the un-uploaded mapping information is narrowed considerably.

Figure 4:
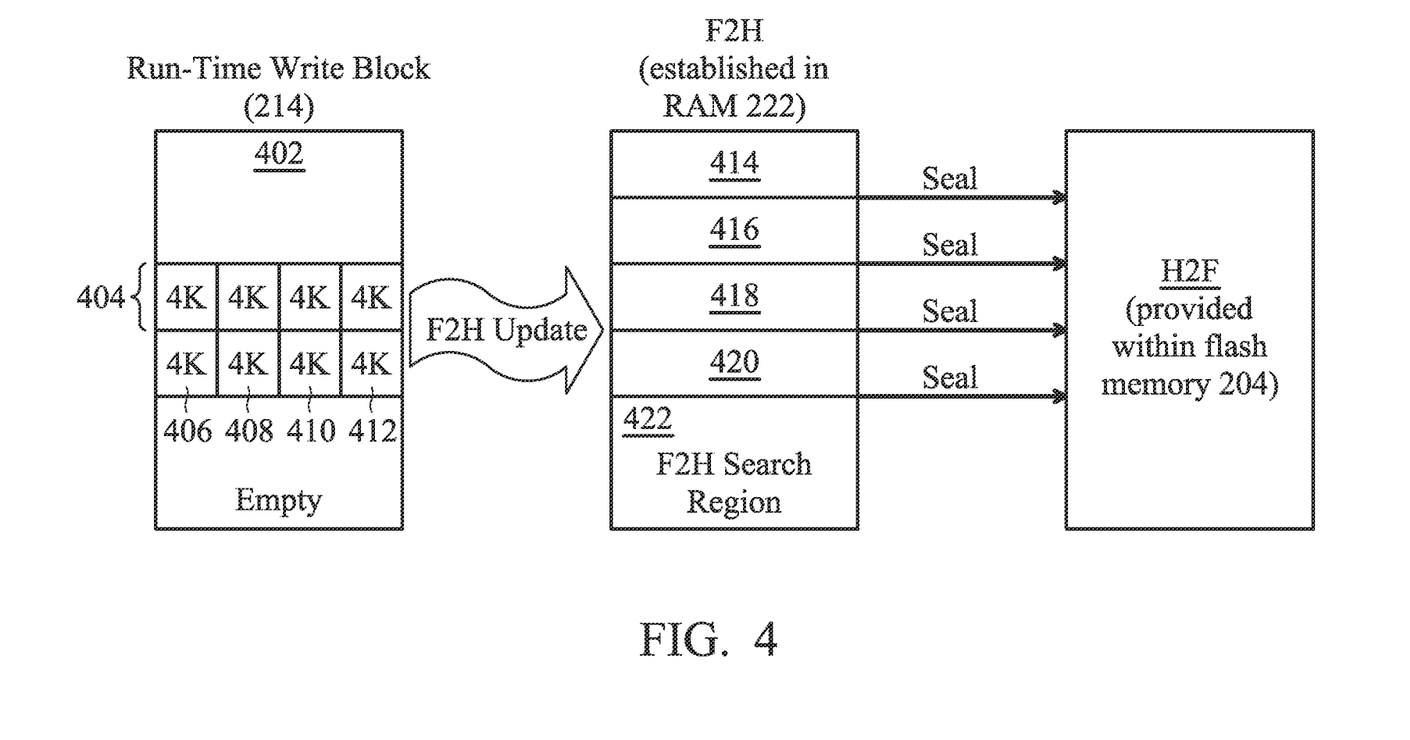
FIG. 4 depicts a run-time and partial F2H→H2F update in accordance with another exemplary embodiment of the disclosure, wherein the physical-to-logical address mapping table F2H is established in the random access memory 222 in accordance with write operations on the run-time write block 214.

FIG. 4 depicts a run-time and partial F2H•H2F update in accordance with another exemplary embodiment of the disclosure, wherein the physical-to-logical address mapping table F2H is established in the random access memory 222 in accordance with write operations on the run-time write block 214. The run-time and partial F2H•H2F update is triggered by a series of user data each shorter than one page. As shown, after the pages 402, a series of short data (a series of 4K data) 404 and 406~412 are written into the run-time write block 214. F2H information is established in the physical-to-logical address mapping table F2H in accordance with the write operations on the run-time write block 214 (e.g., F2H information 414~420 corresponding the pages 402 and the series of 4K data 404 and F2H information contained in space 422 for the series of 4K data 406~412). When detecting the write operations of the series of 4K data 404, the microcontroller 220 of FIG. 2 updates the logical-to-physical address mapping table H2F in accordance with the physical-to-logical address mapping table F2H at intervals between the subsequent write operations of the run-time write block 214. Before the 4K data 406 is written into the run-time write block 214, the logical-to-physical address mapping table H2F is updated in accordance with the F2H information 414. Between the write operation of the 4K data 406 and the write operation of the 4K data 408, the logical-to-physical address mapping table H2F is updated in accordance with the F2H information 416. Between the write operation of the 4K data 408 and the write operation of the 4K data 410, the logical-to-physical address mapping table H2F is updated in accordance with the F2H information 418. Between the write operation of the 4K data 410 and the write operation of the 4K data 412, the logicalto-physical address mapping table H2F is updated in accordance with the F2H information 420. The microcontroller 220 of FIG. 2 may be further configured to use an indicator to indicate the remaining F2H information contained in space 422 (i.e. the un-uploaded mapping information). When a search scheme for the un-uploaded mapping information is requested, the microcontroller 220 is instantly directed to the space 422 in accordance with the indicator, which is very time-saving. The search region for the un-uploaded mapping information is narrowed considerably.

Figure 5:
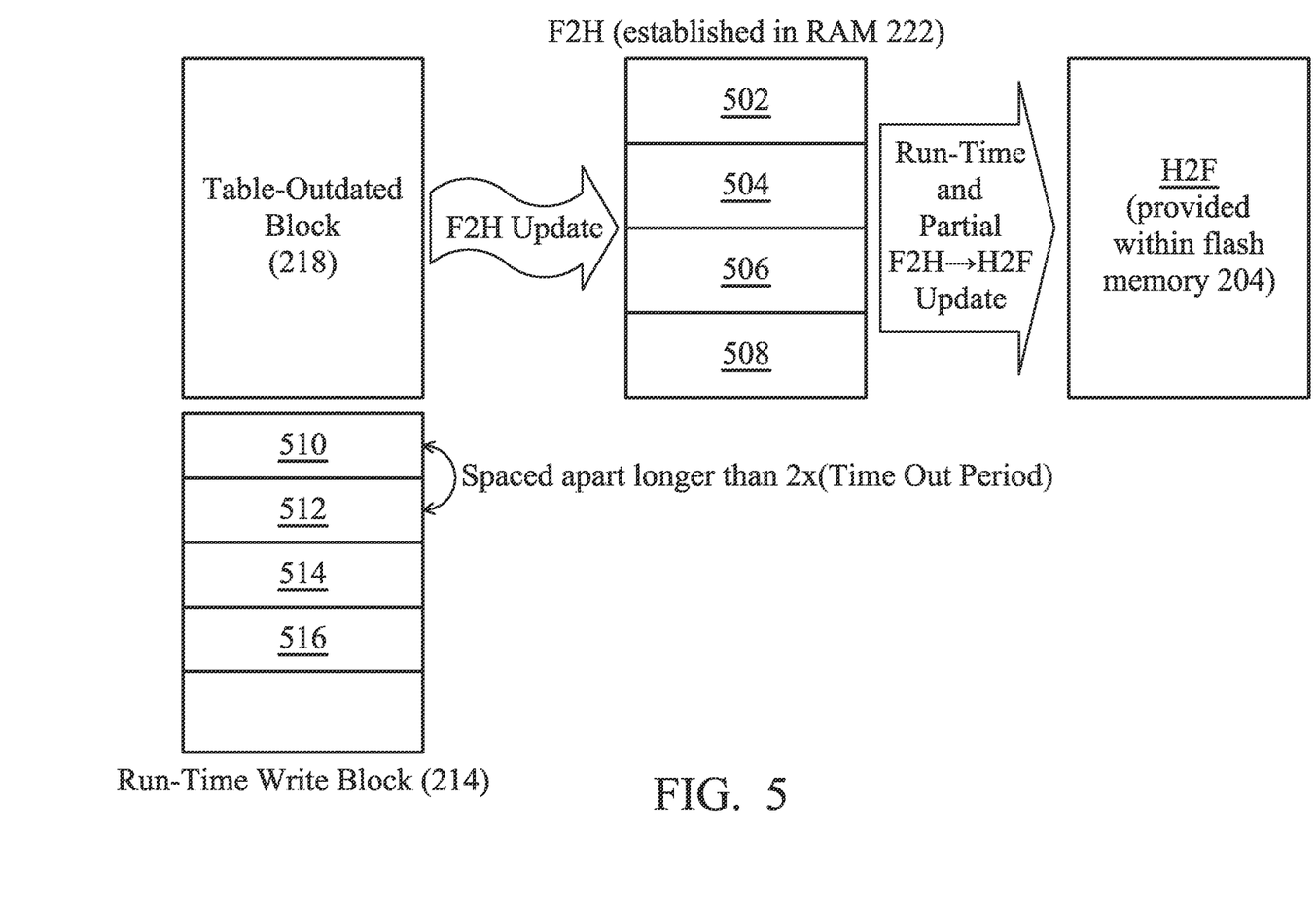
FIG. 5 depicts a run-time and partial F2H→H2F update in accordance with another exemplary embodiment of the disclosure, wherein the physical-to-logical address mapping table F2H is established in the random access memory 222 for the table-outdated block 218.

FIG. 5 depicts a run-time and partial F2H→H2F update in accordance with another exemplary embodiment of the disclosure, wherein the physical-to-logical address mapping table F2H is established in the random access memory 222 for the table-outdated block 218.

In an exemplary embodiment, the microcontroller 220 of FIG. 2 may be configured to allocate the flash memory 204 to provide the run-time write block 214 when the table-outdated block 218 is full. In this case, the microcontroller 220 is configured to update the logical-to-physical address mapping table H2F in accordance with the physical-to-logical address mapping table F2H at intervals between write operations of the run-time write block 214.

In another exemplary embodiment, the microcontroller 220 of FIG. 2 is configured to allocate the flash memory 204 to provide the run-time write block 214 in a power recovery process when a write operation on the table-outdated block 218 was interrupted by an unexpected power-off event. In this case, the microcontroller 220 is configured to restore the physical-to-logical address mapping table F2H in the power recovery process and update the logical-to-physical address mapping table H2F in accordance with the restored physical-to-logical address mapping table F2H at intervals between write operations of the run-time write block 214.

In FIG. 5, the write operation on space 510 and the write operation on space 512 are spaced apart longer than twice the time out period of the data storage device 200. During the time interval between the write operation on space 510 and the write operation on space 512, the microcontroller 220 first updates the logical-to-physical address mapping table H2F in accordance with the F2H information 502 and then updates the logical-to-physical address mapping table H2F in accordance with the F2H information 504. During the time interval between the write operation on space 512 and the write operation on space 514 that is shorter than twice the time out period, the microcontroller 220 updates the logical-to-physical address mapping table H2F in accordance with the F2H information 506. During the time interval between the write operation on space 514 and the write operation on space 516 that is shorter than twice the time out period, the microcontroller 220 updates the logical-to-physical address mapping table H2F in accordance with the F2H information 508. The user data reception and the mapping information update are performed alternately. Furthermore, an indicator may be used to indicate the F2H information which has not been used in the update of the logical-to-physical address mapping table H2F.

Figure 6:
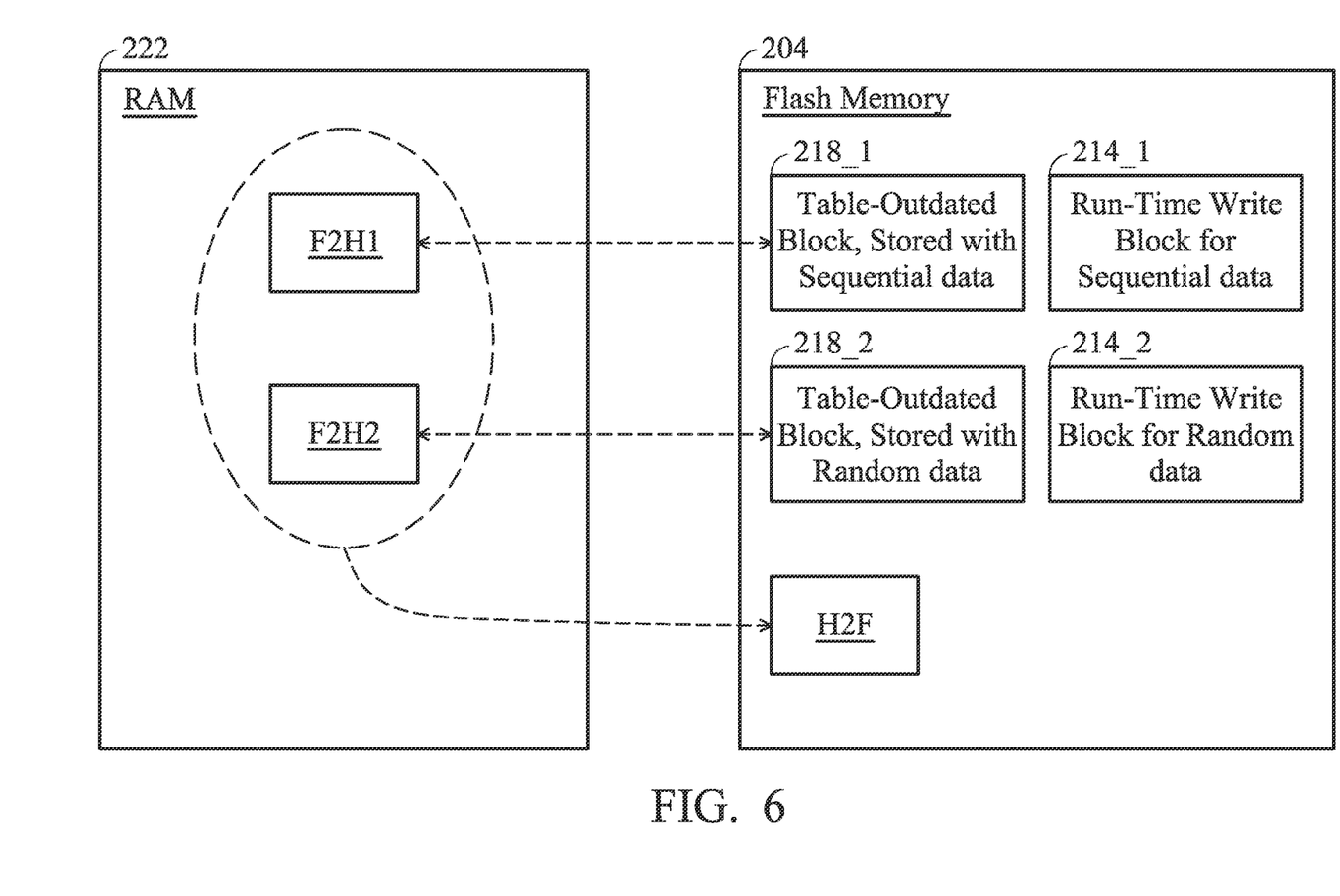
FIG. 6 depicts the block allocation and mapping information update for the two types of write operations.

In some exemplary embodiments, the write operations issued from the host 202 are classified into different types. For example, sequential data and random data may be written into the flash memory 204 separately. FIG. 6 depicts the block allocation and the mapping information update for the two types of write operations. A run-time write block 214_1 and a table-outdated block 218_1 are provided for write operations of sequential data while a run-time write block 214_2 and a table-outdated block 218_2 are provided for write operations of random data. F2H information corresponding to the table-outdated block 218_1 is recorded in the physical-to-logical address mapping table F2H1. F2H information corresponding to the table-outdated block 218_2 is recorded in the physical-to-logical address mapping table F2H2.

In an exemplary embodiment, the microcontroller 220 of FIG. 2 is configured to allocate the flash memory 204 to provide the run-time write block 214_1 when the table-outdated block 218_1 is full. The microcontroller 220 updates the logical-to-physical address mapping table H2F in accordance with the physical-to-logical address mapping table F2H1 at intervals between write operations of the run-time write block 214_1. The microcontroller 220 is configured to allocate the flash memory 204 to provide the run-time write block 214_2 when the table-outdated block 218_2 is full. The microcontroller 220 updates the logical-to-physical address mapping table H2F in accordance with the physical-to-logical address mapping table F2H2 at intervals between write operations of the run-time write block 214_2.

In another exemplary embodiment, the microcontroller 220 of FIG. 2 is configured to allocate the flash memory 204 to provide the run-time write block 214_1 in a power recovery process when a write operation on a table-outdated block 218_1 was interrupted by an unexpected power-off event. The microcontroller 220 is configured to restore the physical-to-logical address mapping table F2H1 in the power recovery process. The microcontroller 220 updates the logical-to-physical address mapping table H2F in accordance with the restored physical-to-logical address mapping table F2H1 at intervals between write operations of the run-time write block 214_1. The microcontroller 220 is configured to allocate the flash memory 204 to provide the run-time write block 214_2 in the power recovery process when a write operation on the table-outdated block 218_2 was interrupted by the unexpected power-off event. The microcontroller 220 is configured to restore the physical-to-logical address mapping table F2H2 in the power recovery process. The microcontroller 220 updates the logical-to-physical address mapping table H2F in accordance with the restored physical-to-logical address mapping table F2H2 at intervals between write operations of the run-time write block 214_2.

Any technique using the aforementioned concept to control a flash memory is within the scope of the invention. The invention further involves flash memory control methods, which are not limited to any specific controller architecture.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
   a flash memory, divided into a plurality of blocks with each block comprising a plurality of pages; and
   a control unit, coupling the flash memory to a host and comprising a microcontroller and a random access memory,
   wherein:
   the microcontroller is configured to allocate the flash memory to provide a first run-time write block from the blocks;

between a first write operation and a second write operation of the first run-time write block, the microcontroller updates a logical-to-physical address mapping table in accordance with a first section of physical-to-logical information while a second section of physical-to-logical information is waiting to be updated to the logical-to-physical address mapping table in a time interval between another pair of write operations performed on the first run-time write block;
the logical-to-physical address mapping table is provided within the flash memory; and
a first physical-to-logical address mapping table that provides the first and second sections of physical-to-logical information is established in the random access memory to record logical addresses corresponding to physical addresses of one block.

2. The data storage device as claimed in claim 1, wherein:
the microcontroller establishes the first physical-to-logical address mapping table in accordance with write operations issued from the host to write the first run-time write block.

3. The data storage device as claimed in claim 2, wherein:
after writing a series of user data, each shorter than one page, into the first run-time write block, the microcontroller is configured to update the logical-to-physical address mapping table in accordance with the first physical-to-logical address mapping table at intervals between subsequent write operations of the first run-time write block.

4. The data storage device as claimed in claim 1, wherein:
the microcontroller is configured to allocate the flash memory to provide the first run-time write block when a first table-outdated block between the blocks of the flash memory and corresponding to the first physical-to-logical address mapping table is full; and
the microcontroller is configured to update the logical-to-physical address mapping table in accordance with the first physical-to-logical address mapping table at intervals between write operations of the first run-time write block.

5. The data storage device as claimed in claim 4, wherein:
the microcontroller is configured to further allocate the flash memory to provide a second run-time write block from the blocks when a second table-outdated block between the blocks of the flash memory and corresponding to a second physical-to-logical address mapping table established in the random access memory is full;
the microcontroller is configured to update the logical-to-physical address mapping table in accordance with the second physical-to-logical address mapping table at intervals between write operations of the second run-time write block;
the first run-time write block and the first table-outdated block are provided for write operations of a first type; and
the second run-time write block and the second table-outdated block are provided for write operations of a second type.

6. The data storage device as claimed in claim 1, wherein:
the microcontroller is configured to allocate the flash memory to provide the first run-time write block in a power recovery process when a write operation on a first table-outdated block between the blocks of the flash memory and corresponding to the first physical-to-logical address mapping table was interrupted by an unexpected power-off event;
the microcontroller is configured to restore the first physical-to-logical address mapping table in the power recovery process; and
the microcontroller is configured to update the logical-to-physical address mapping table in accordance with the restored first physical-to-logical address mapping table at intervals between write operations of the first run-time write block.

7. The data storage device as claimed in claim 6, wherein:
the microcontroller is configured to further allocate the flash memory to provide a second run-time write block from the blocks in the power recovery process when a write operation on a second table-outdated block between the blocks of the flash memory and corresponding to a second physical-to-logical address mapping table established in the random access memory was interrupted by the unexpected power-off event;
the microcontroller is configured to restore the second physical-to-logical address mapping table in the power recovery process;
the microcontroller is configured to update the logical-to-physical address mapping table in accordance with the restored second physical-to-logical address mapping table at intervals between write operations of the second run-time write block;
the first run-time write block and the first table-outdated block are provided for write operations of a first type; and
the second run-time write block and the second table-outdated block are provided for write operations of a second type.

8. The data storage device as claimed in claim 1, wherein:
the microcontroller is further configured to use an indicator to indicate a section of the first physical-to-logical address mapping table that has not been used in the update of the logical-to-physical address mapping table yet; and
the microcontroller is configured to search the first physical-to-logical address mapping table in accordance with the indicator.

9. A flash memory control method, comprising:
allocating a flash memory to provide a first run-time write block from a plurality of blocks of the flash memory, each block comprising a plurality of pages; and
between a first write operation and a second write operation of the first run-time write block, updating a logical-to-physical address mapping table in accordance with a first section of physical-to-logical information while a second section of physical-to-logical information is waiting to be updated to the logical-to-physical address mapping table in a time interval between another pair of write operations performed on the first run-time write block,
wherein:
the logical-to-physical address mapping table is provided within the flash memory; and
a first physical-to-logical address mapping table that provides the first and second sections of physical-to-logical information is established in the random access memory to record logical addresses corresponding to physical addresses of one block.

10. The flash memory control method as claimed in claim 9, wherein:
the first physical-to-logical address mapping table is established in accordance with write operations issued from a host to write the first run-time write block.

11. The flash memory control method as claimed in claim 10, wherein:
after a series of user data each shorter than one page is written into the first run-time write block, the logical-to-physical address mapping table is updated in accordance with the first physical-to-logical address mapping table at intervals between subsequent write operations of the first run-time write block.

12. The flash memory control method as claimed in claim 9, wherein:
the flash memory is allocated to provide the first run-time write block when a first table-outdated block between the blocks of the flash memory and corresponding to the first physical-to-logical address mapping table is full; and
the logical-to-physical address mapping table is updated in accordance with the first physical-to-logical address mapping table at intervals between write operations of the first run-time write block.

13. The flash memory control method as claimed in claim 12, further comprising:
allocating the flash memory to provide a second run-time write block from the blocks when a second table-outdated block between the blocks of the flash memory and corresponding to a second physical-to-logical address mapping table established in the random access memory is full;
updating the logical-to-physical address mapping table in accordance with the second physical-to-logical address mapping table at intervals between write operations of the second run-time write block,
wherein:
the first run-time write block and the first table-outdated block are provided for write operations of a first type; and
the second run-time write block and the second table-outdated block are provided for write operations of a second type.

14. The flash memory control method as claimed in claim 9, wherein:
the flash memory is allocated to provide the first run-time write block in a power recovery process when a write operation on a first table-outdated block between the blocks of the flash memory and corresponding to the first physical-to-logical address mapping table was interrupted by an unexpected power-off event;
the first physical-to-logical address mapping table is restored in the power recovery process; and
the logical-to-physical address mapping table is updated in accordance with the restored first physical-to-logical address mapping table at intervals between write operations of the first run-time write block.

15. The flash memory control method as claimed in claim 14, further comprising:
allocating the flash memory to provide a second run-time write block from the blocks in the power recovery process when a write operation on a second table-outdated block between the blocks of the flash memory and corresponding to a second physical-to-logical address mapping table established in the random access memory was interrupted by the unexpected power-off event;
restoring the second physical-to-logical address mapping table in the power recovery process;
updating the logical-to-physical address mapping table in accordance with the restored second physical-to-logical address mapping table at intervals between write operations of the second run-time write block,
wherein:
the first run-time write block and the first table-outdated block are provided for write operations of a first type; and
the second run-time write block and the second table-outdated block are provided for write operations of a second type.

16. The flash memory control method as claimed in claim 9, further comprising:
using an indicator to indicate a section of the first physical-to-logical address mapping table that has not been used in the update of the logical-to-physical address mapping table yet; and
searching the first physical-to-logical address mapping table in accordance with the indicator.

\* \* \* \* \*